(12) United States Patent
Yamazaki

(10) Patent No.: US 7,469,374 B2
(45) Date of Patent: Dec. 23, 2008

(54) CIRCUIT FOR GENERATING A CYCLIC CODE

(75) Inventor: Masato Yamazaki, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 514 days.

(21) Appl. No.: 11/175,377

(22) Filed: Jul. 7, 2005

(65) Prior Publication Data

US 2006/0041825 A1    Feb. 23, 2006

(30) Foreign Application Priority Data

Aug. 23, 2004    (JP) .............................. 2004-242141

(51) Int. Cl.
    *H03M 13/00*    (2006.01)
(52) U.S. Cl. .................... 714/781; 714/758; 714/786
(58) Field of Classification Search .................. 714/752, 714/781, 786, 758
    See application file for complete search history.

(56) References Cited

U.S. PATENT DOCUMENTS

| | | | | |
|---|---|---|---|---|
| 4,928,280 A | * | 5/1990 | Nielson et al. | 714/762 |
| 5,321,704 A | * | 6/1994 | Erickson et al. | 714/781 |
| 5,652,718 A | * | 7/1997 | Thomson et al. | 708/209 |
| 6,263,420 B1 | * | 7/2001 | Tan et al. | 712/42 |
| 6,754,870 B2 | * | 6/2004 | Yoshida et al. | 714/758 |
| 6,763,492 B1 | * | 7/2004 | Hurt et al. | 714/752 |
| 6,851,086 B2 | * | 2/2005 | Szymanski | 714/781 |
| 7,139,963 B1 | * | 11/2006 | Fox | 714/758 |

FOREIGN PATENT DOCUMENTS

JP    05-344006    12/1993

* cited by examiner

*Primary Examiner*—Esaw Abraham
(74) *Attorney, Agent, or Firm*—Studebaker & Brackett PC; Donald R. Studebaker

(57) ABSTRACT

A cyclic code is generated by a circuit including a group of logic gates that generate one multiple-bit code segment from another multiple-bit code segment. The logic gates receive B initial bits, where B is the degree of the generator polynomial, and generate one complete $(2^B-1)$-bit code cycle, from which a clocked address generator and a barrel shifter select successive C-bit segments for output (C>1). This arrangement outputs C bits of code per clock pulse and therefore does not require a special high-frequency clock signal.

5 Claims, 4 Drawing Sheets

```
If (ADR==0)        OUT[3 : 0]=C[3 : 0] ;
Else if(ADR==1)    OUT[3 : 0]=C[4 : 1] ;
Else if(ADR==2)    OUT[3 : 0]=C[5 : 2] ;
Else if(ADR==3)    OUT[3 : 0]=C[6 : 3] ;
Else if(ADR==4)    OUT[3 : 0]=C[7 : 4] ;
Else if(ADR==5)    OUT[3 : 0]=C[8 : 5] ;
Else if(ADR==6)    OUT[3 : 0]=C[9 : 6] ;
Else if(ADR==7)    OUT[3 : 0]=C[10 : 7] ;
Else if(ADR==8)    OUT[3 : 0]=C[11 : 8] ;
Else if(ADR==9)    OUT[3 : 0]=C[12 : 9] ;
Else if(ADR==10)   OUT[3 : 0]=C[13 : 10] ;
Else if(ADR==11)   OUT[3 : 0]=C[14 : 11] ;
Else if(ADR==12)   OUT[3 : 0]={C[0], [14 : 12] ;}
Else if(ADR==13)   OUT[3 : 0]={C[1 : 0], [14 : 13] ;}
Else               OUT[3 : 0]={C[2 : 0], [14 ] ;}
```

FIG. 5

| ADR[3:0] | LSB | | MSB | | |
|---|---|---|---|---|---|
| "0" | 0 | 0 | 0 | 1 | ←LSB |
| | 1 | 0 | 0 | 0 | C[3:0] |
| | 0 | 1 | 0 | 0 | |
| | 0 | 0 | 1 | 0 | ←MSB |
| "4" | 1 | 0 | 0 | 1 | |
| | 1 | 1 | 0 | 0 | C[7:4] |
| | 0 | 1 | 1 | 0 | |
| | 1 | 0 | 1 | 1 | |
| "8" | 0 | 1 | 0 | 1 | |
| | 1 | 0 | 1 | 0 | C[11:8] |
| | 1 | 1 | 0 | 1 | |
| | 1 | 1 | 1 | 0 | |
| "12" | 1 | 1 | 1 | 1 | |
| | 0 | 1 | 1 | 1 | C[14:12] |
| | 0 | 0 | 1 | 1 | |
| | 0 | 0 | 0 | 1 | C[0] |
| "1" | 1 | 0 | 0 | 0 | |
| | 0 | 1 | 0 | 0 | C[4:1] |
| | 0 | 0 | 1 | 0 | |
| | 1 | 0 | 0 | 1 | |
| "5" | 1 | 1 | 0 | 0 | |
| | 0 | 1 | 1 | 0 | C[8:5] |
| | 1 | 0 | 1 | 1 | |
| | 0 | 1 | 0 | 1 | |
| "9" | 1 | 0 | 1 | 0 | |
| | 1 | 1 | 0 | 1 | C[12:9] |
| | 1 | 1 | 1 | 0 | |
| | 1 | 1 | 1 | 1 | |

CIRCUIT FOR GENERATING A CYCLIC CODE

BACKGROUND OF THE INVENTION

1. Field of the Invention

The present invention relates to a circuit for generating a cyclic code for use in, for example, an encoding or scrambling apparatus.

2. Description of the Related Art

Cyclic codes are conventionally generated by a linear feedback shift register having a structure determined by a generator polynomial. As illustrated in FIG. 1 (for the generator polynomial $Y=X^4+X+1$), the structure includes a plurality of register cells (R) 26, 27, 28, 29 and a logical exclusive OR (XOR) gate 30. A reset signal sets an initial value of "1" in register cell 29 and "0" in the other register cells 26, 27, 28.

The output of register cell 28 and the output of register cell 29, which is the output of the cyclic code generating circuit, are input to the exclusive OR gate 30 and XORed, and the result is sent to register cell 26. The register cells 26, 27, 28, 29 are interconnected to operate as a shift register driven by a clock signal (CLK). At the next pulse of the clock signal CLK, the existing values in register cells 26, 27, and 28 are stored in register cells 27, 28, and 29, respectively, and the XOR result is stored in register cell 26.

As a result, the contents of register cells 26, 27, 28 and 29 change from (0, 0, 0, 1) to (1, 0, 0, 0), from (1, 0, 0, 0) to (0, 1, 0, 0), from (0, 1, 0, 0) to (0, 0, 1, 0), and so on at successive clock pulses, and values of "1", "0", "0", "0", and so on are output as output data. The register cell contents at successive clock pulses are indicated in the vertical columns from LSB (least significant bit, register cell 26) to MSB (most significant bit, register cell 29) in FIG. 5, the output data being the content of the MSB column. The output data are XORed with data to be encoded or scrambled, generating encoded data or scrambled data.

Further information can be found in Japanese Patent Application Publication No. H5-344006.

When a cyclic code circuit with the structure described above is used, the output is serial: only one bit is output at each clock pulse. Accordingly, when the data to be encoded or scrambled are in parallel form, with multiple bits arriving at each clock pulse, the conventional cyclic code circuit requires a special high-frequency clock signal in order to output enough code bits to match the bit width of the input data.

SUMMARY OF THE INVENTION

An object of the present invention is to provide a cyclic code circuit that can operate in applications requiring the simultaneous processing of a plurality of bits without the need for a special high-frequency clock signal.

The invented circuit includes a group of logic gates, such as exclusive OR gates, that generate one multiple-bit segment of the cyclic code from another multiple-bit segment of the cyclic code.

In one preferred embodiment, the group of logic gates receives a B-bit segment of the cyclic code, where B is the degree of the generator polynomial of the code, and generates one complete ($2^B-1$)-bit cycle of the code. An address generator and a barrel shifter then select successive C-bit segments of the cycle, where C is the number of bits to be processed simultaneously.

In another preferred embodiment, the group of logic gates receives a C-bit segment of the cyclic code from a C-bit register and generates the next C-bit segment, which is then stored in the register.

The address generator or register operates in synchronization with a clock signal. The logic gates operate substantially instantly, enabling C bits to be generated at each pulse of the clock signal.

BRIEF DESCRIPTION OF THE DRAWINGS

In the attached drawings:

FIG. 5 compares the output of the cyclic code circuit in the first embodiment with the output of the conventional cyclic code circuit.

DETAILED DESCRIPTION OF THE INVENTION

Figure 1:
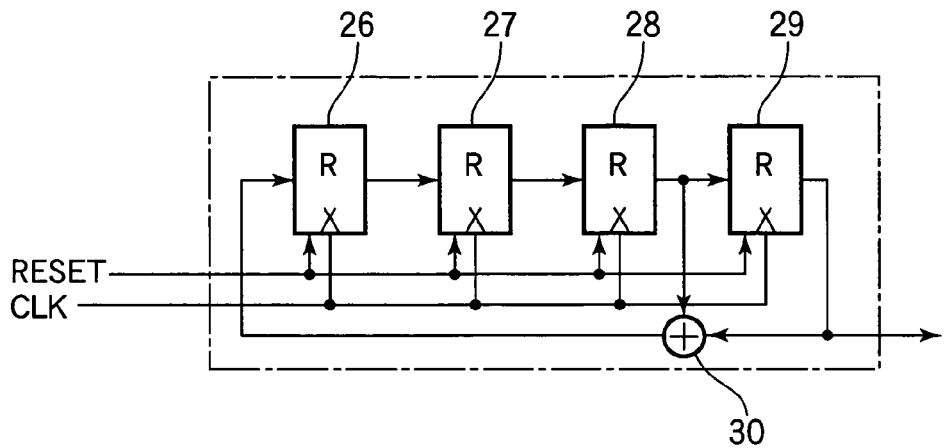
FIG. 1 is a block diagram showing the structure of a conventional cyclic code circuit.

Embodiments of the invention will now be described with reference to the attached drawings, in which like elements are indicated by like reference characters.

FIRST EMBODIMENT

The first embodiment generates four-bit parallel output code data, for use in processing four-bit parallel data input to a scrambling or encoding (or descrambling or decoding) device, using the same generator polynomial as the conventional cyclic code circuit shown in FIG. 1.

Figure 2:
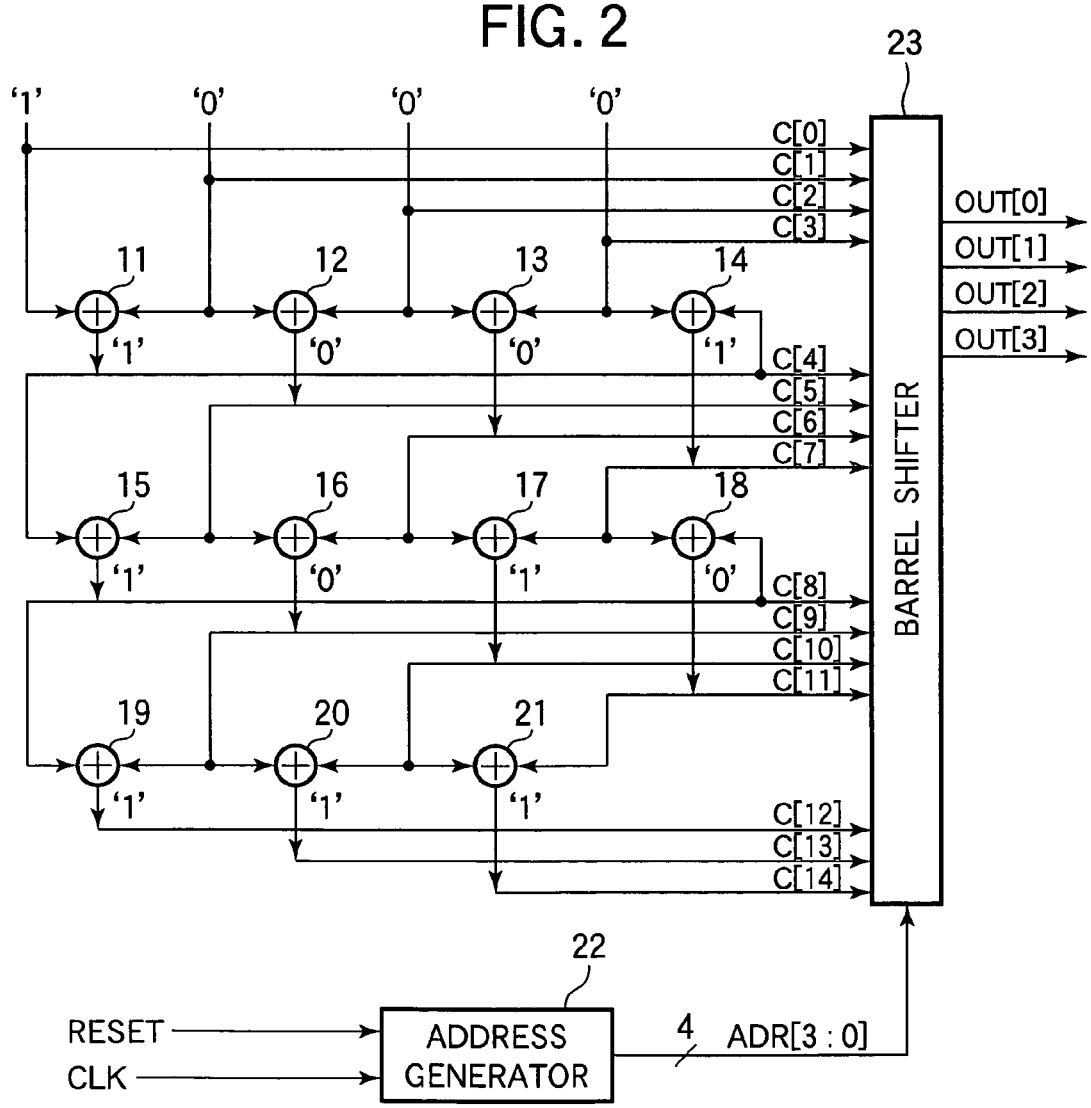
FIG. 2 is a block diagram showing the structure of a cyclic code circuit in a first embodiment of the invention.

Referring to FIG. 2, the first embodiment comprises a plurality of two-input exclusive OR (XOR) gates 11 to 21, an address generator 22, and a barrel shifter 23. As input data C[0], a binary "1" bit is input to the barrel shifter 23 and to XOR gate 11. As input data C[1], a "0" bit is input to the barrel shifter 23 and to XOR gates 11 and 12. Similarly, as input data C[2] and C[3], "0" bits are input to the barrel shifter 23, to XOR gates 12 and 13, and to XOR gates 13 and 14. This last XOR gate 14 also receives the output of XOR gate 11.

In this structure, XOR gate 11 outputs a "1", which is input to the barrel shifter 23 as input data C[4]. XOR gate 12 outputs a "0", which is input to the barrel shifter 23 as input data C[5]. XOR gate 13 outputs a "0", which is input to the barrel shifter 23 as input data C[6]. XOR gate 14 outputs a "1", which is input to the barrel shifter 23 as input data C[7].

XOR gate 15 receives the output data of XOR gates 11 and 12 and outputs a "1", which is input to the barrel shifter 23 as input data C[8]. XOR gate 16 receives the output data of XOR gates 12 and 13 and outputs a "0", which is input to the barrel shifter 23 as input data C[9]. XOR gate 17 receives the output data of XOR gates 13 and 14 and outputs a "1", which is input to the barrel shifter 23 as input data C[10]. XOR gate 18 receives the output data of XOR gates 14 and 15 and outputs a "0", which is input to the barrel shifter 23 as input data C[11].

XOR gate 19 receives the output data of XOR gates 15 and 16 and outputs a "1", which is input to the barrel shifter 23 as input data C[12]; XOR gate 20 receives the output data of XOR gates 16 and 17 and outputs a "1", which is input to the barrel shifter 23 as input data C[13]; XOR gate 21 receives the output data of XOR gates 17 and 18 and outputs a "1", which is input to the barrel shifter 23 as input data C[14].

The address generator 22 receives a reset signal (RESET) and the clock signal (CLK) and outputs a four-bit address signal ADR[3:0], which is input to the barrel shifter 23. Operating according to the address signal, the barrel shifter 23 selects four bits from among the signals C[0] to C[14] output from XOR gates 11 to 21 and outputs them as output data OUT[3:0].

Figures 3, 4:
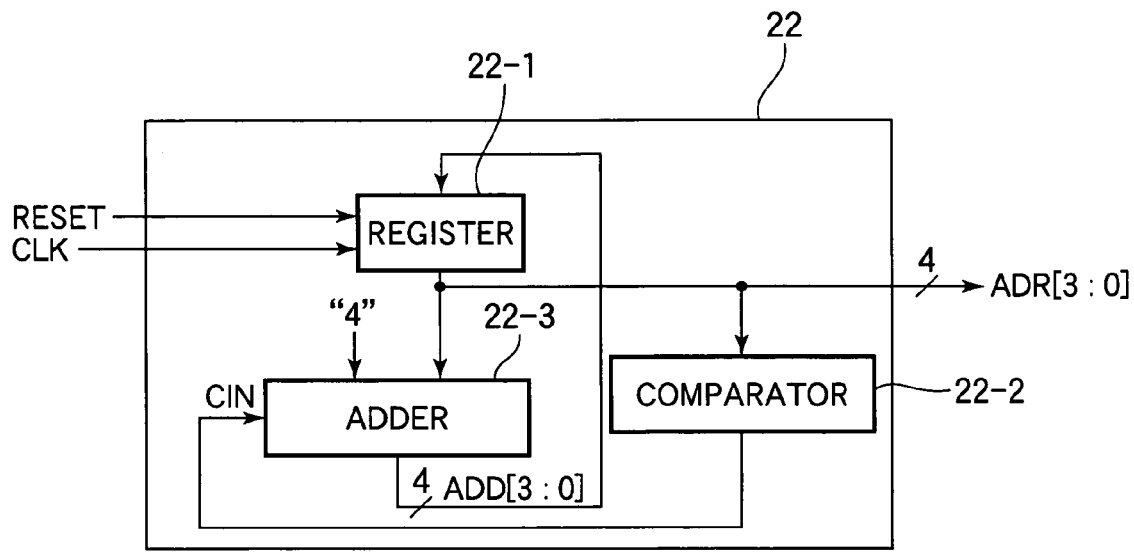
FIG. 3 is a block diagram showing the structure of the address generator in FIG. 2.
FIG. 4 illustrates the contents of the internal function table of the barrel shifter in FIG. 2.

FIG. 3 shows the internal structure of the address generator 22 in the first embodiment. The address generator 22 generates a base-fifteen address signal with a value that is reset to zero when it reaches fifteen, which is the number of bits in one cycle of the cyclic code.

In the address generator 22, a register 22-1 receives the reset signal RESET and the clock signal CLK and outputs the address signal ADR[3:0]. A comparator 22-2 compares the address signal ADR[3:0] with a constant value of ten ("10") and outputs a carry signal with a value of "1" when ADR[3:0] exceeds ten and a value of "0" when ADR[3:0] is equal to or less than ten. An adder 22-3 receives the carry signal at its carry input (CIN) terminal and adds the carry signal, the address signal ADD[3:0], and a constant value of four ("4"). The register 22-1 receives the sum output from the adder 22-3 and stores it in synchronization with the clock signal CLK.

FIG. 4 illustrates the internal operation of the barrel shifter 23 in the first embodiment in the form of a conditional logic statement. The barrel shifter 23 selects four bits from among its input data C[14:0] according to the address signal ADR[3:0] and supplies the selected bits as output data OUT[3:0]. If, for example, ADR[3:0] is "0", the four bits C[3:0] are selected and output as output data OUT[3:0].

The first embodiment requires $A \cdot (2^B - 1 - B)$ XOR gates, where A is the number of addition operations on terms of positive degree in the generator polynomial (the number of XOR gates in FIG. 1) and B is the maximum degree. If the generator polynomial is $Y = X^4 + X + 1$, as assumed in this description, then A=1 and B=4, so the number of exclusive OR gates is $1 \times (2^4 - 1 - 4) = 11$.

The number of bits stored in the register 22-1 and output at one time by the address generator 22 is equal to the maximum degree B. The formula for the constant comparison value supplied to the comparator 22-2 in the address generator 22 is $(2^B - 1) - C - 1$, where C is the number of bits output from the barrel shifter 23; in this description B and C are both four (B=4, C=4), so the constant comparison value is ten, as noted above. The constant value added by the adder 22-3 to the address value and carry signal is equal to C (4 in this description).

The barrel shifter 23 receives $(2^B - 1)$ bits of input data constituting one $(2^B - 1)$-bit cycle of the cyclic code, receives B bits as an address signal, and supplies C bits of code data.

The operation of the cyclic code circuit will be described below.

When the address generator 22 receives a reset signal, the register 22-1 is reset to all zero bits (0, 0, 0, 0), and the address signal supplied to the barrel shifter 23 has a value of zero ("0"). Input data C[3:0] are selected as the output of the barrel shifter 23; the output value is "1" (0, 0, 0, 1). In the address generator 22, since the register 22-1 outputs "0", the comparator 22-2 outputs the value "0" as a carry signal. The adder 22-3 adds the constant value "4" and the carry value "0" to the address value "0", sending the sum "4" (0, 1, 0, 0) to the register 22-1.

At the next clock pulse, the register 22-1 outputs the value "4", which the barrel shifter 23 receives as an address signal. Input data C[7:4] are selected as the output of the barrel shifter 23; the output value is "9" (1, 0, 0, 1). In the address generator 22, since the register 22-1 outputs "4", the comparator 22-2 outputs the value "0" as a carry signal. The adder 22-3 adds the constant value "4" and the carry value "0" to the address value "4", sending the sum "8" (1, 0, 0, 0) to the register 22-1.

At the next clock pulse, the register 22-1 outputs the value "8", which the barrel shifter 23 receives as an address signal. Input data C[11:8] are selected as the output of the barrel shifter 23; the output value is "5" (0, 1, 0, 1). In the address generator 22, since the register 22-1 outputs "8", the comparator 22-2 outputs the value "0" as a carry signal. The adder 22-3 adds the constant value "4" and the carry value "0" to the address value "8", sending the sum "12" (1, 1, 0, 0) to the register 22-1.

At the next clock pulse, the register 22-1 outputs the value "12", which the barrel shifter 23 receives as an address signal. Input data C[0] and C[14:12] are selected as the output of the barrel shifter 23; the output value is hexadecimal "F" (1, 1, 1, 1). In the address generator 22, since the register 22-1 outputs "12", the comparator 22-2 outputs the value "1" as a carry signal. The adder 22-3 adds the constant value "4" and the carry value "1" to the address value "12", sending the sum "1" (0, 0, 0, 1) to the register 22-1.

At the next clock pulse, the register 22-1 outputs the value "1", which the barrel shifter 23 receives as an address signal. Input data C[4:1] are selected as the output of the barrel shifter 23; the output value is "8" (1, 0, 0, 0). In the address generator 22, since the register 22-1 outputs "1", the comparator 22-2 outputs the value "0" as a carry signal. The adder 22-3 adds the constant value "4" and the carry value "0" to the address value "1", sending the sum "5" (0, 1, 0, 1) to the register 22-1.

As the processing described above is repeated, the barrel shifter 23 receives base-fifteen address signals, which are generated in the address generator 22, and outputs four-bit cyclic codes according to the input data shown in the form of the conditional logic statement in FIG. 4.

FIG. 5 illustrates the relationship between the serial output of the conventional cyclic code circuit in FIG. 1 and the parallel output of the first embodiment when the address signal ADR[3:0] is "0", "4", "8", . . . The serial output data of the conventional cyclic code circuit are 1, 0, 0, 0, 1, 0, 0, 1 . . . in order from top to bottom of the MSB column, one bit being output at each clock cycle. The first embodiment outputs the same data in four-bit units (1, 0, 0, 0), (1, 0, 0, 1), (1, 0, 1, 0), (1, 1, 1, 1), (0, 0, 0, 1) . . . indicated by the ellipses in the MSB column, one four-bit unit being output at each clock pulse. In each four bit-unit, the top bit is the least significant bit (OUT[0]) and the bottom bit is the most significant bit (OUT[3]).

For a given clock rate, the cyclic code circuit in FIG. 2 is therefore four times as fast as the conventional cyclic code circuit in FIG. 1. To generate cyclic code data for scrambling or encoding four-bit-wide input data, the cyclic code circuit in FIG. 2 can be driven by the input data clock signal, instead of requiring a special quadruple-speed clock signal as would be required by the conventional cyclic code circuit in FIG. 1.

SECOND EMBODIMENT

The second embodiment generates four-bit parallel output with the same generator polynomial as the cyclic code circuit in the first embodiment.

Figure 6:
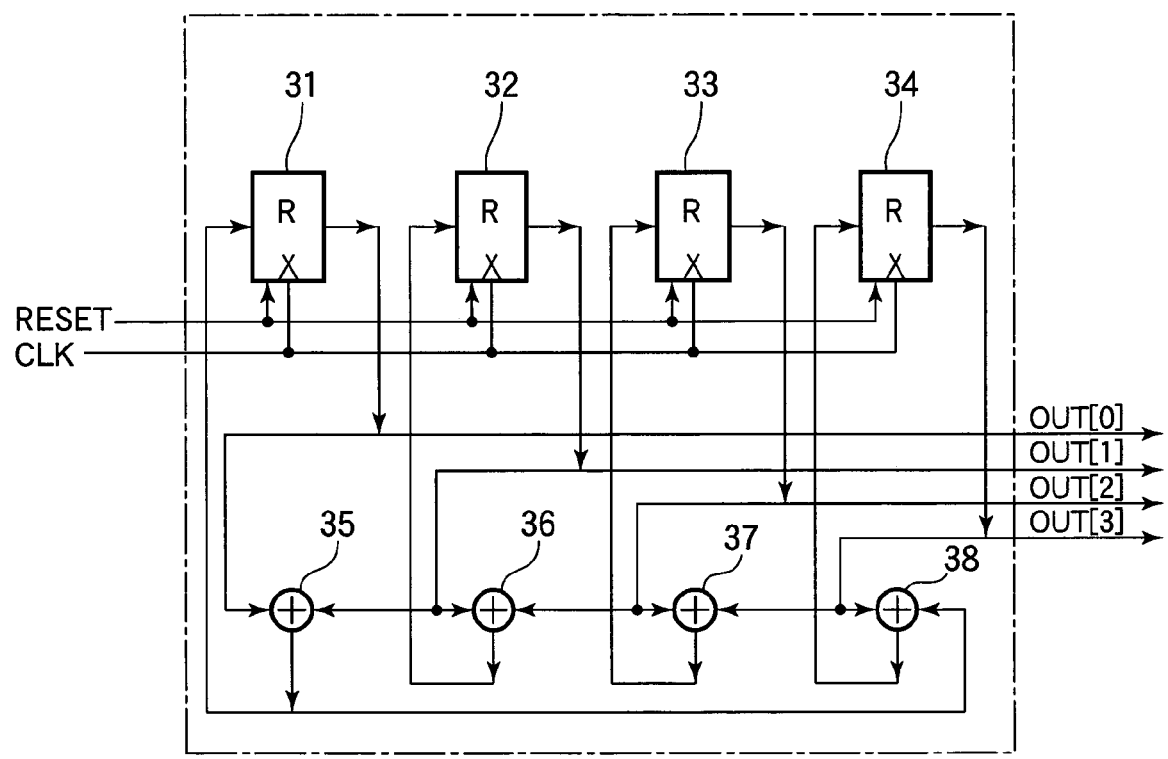
FIG. 6 is a block diagram showing the structure of a cyclic code circuit in a second embodiment of invention.

Referring to FIG. 6, the second embodiment comprises a plurality of register cells 31 to 34 and a plurality of two-input XOR gates 35 to 38. In a cyclic code circuit that generates C bits of a cyclic code simultaneously, the second embodiment includes C one-bit registers and A·C exclusive OR gates, where A is the number of addition operations on terms of positive degree in the generator polynomial (the number of exclusive OR gates in FIG. 1). If the generator polynomial is $Y=X^4+X+1$, as assumed in this description, then A=1 and C=4, so the number of registers is four, and the number of exclusive OR gates is four.

In the cyclic code circuit in the second embodiment, the input clock signal CLK and a reset signal RESET are input to register cells (R) 31 to 34. The output of register cell 31 is output as an output signal OUT[0] and input to XOR gate 35. The output of register cell 32 is output as an output signal OUT[1] and input to XOR gates 35 and 36. The output of register cell 33 is output as an output signal OUT[2] and input to XOR gates 36 and 37. The output of register cell 34 is output as an output signal OUT[3] and input to XOR gates 37 and 38.

Register cell 31 and XOR gate 38 receive the output of XOR gate 35; register cell 32 receives the output of XOR gate 36; register cell 33 receives the output of XOR gate 37; register cell 34 receives the output of XOR gate 38.

The operation of the cyclic code circuit will be described below.

When a reset signal is input to register cells 31 to 34, register cells 31 to 34 are reset to the value (1, 0, 0, 0), which is output as an output signal OUT[3:0]. In the notation (1, 0, 0, 0), the least significant bit (the "1" output as OUT[0]) is now on the left and the most significant bit (the "0" output as OUT[3]) is on the right, so the hexadecimal output value is "1".

At the next clock pulse, the output values (1, 0, 0, 1) of XOR gates 35 to 38 are stored in register cells 31 to 34, and this value (1, 0, 0, 1) (hexadecimal "9") is output as an output signal; the output values of XOR gates 35 to 38 are (1, 0, 1, 0).

At the next clock pulse, the output values (1, 0, 1, 0) of XOR gates 35 to 38 are stored in register cells 31 to 34, and this value (1, 0, 1, 0) (hexadecimal "5") is output as an output signal; the output values of XOR gates 35 to 38 now change to (1, 1, 1, 1).

At the next clock pulse, the output values (1, 1, 1, 1) of XOR gates 35-38 are stored in register cells 31 to 34, and this value (1, 1, 1, 1) (hexadecimal "F") is output as an output signal; the output value of XOR gates 35 to 38 now changes to (0, 0, 1, 1). Operation continues in this way, generating the same sequence of four-bit output code data as in the first embodiment.

Like the first embodiment, the cyclic code circuit in the second embodiment can output a cyclic code multiple bits at a time to match the bit width of the input data to which the cyclic code is applied for encoding or scrambling, without the need for a special high-frequency clock signal as required in the conventional cyclic code circuit. The second embodiment requires fewer circuit elements than the first embodiment, and the number of circuit elements increases only in proportion to the degree of the generator polynomial, not in proportion to the number of bits in one cycle of the cyclic code as in the first embodiment.

Those skilled in the art will recognize that the structure of the groups of logic gates in the preceding embodiments can be altered in various ways, the generator polynomial can be changed, and other variations are possible within the scope of the invention, which is defined in the appended claims.

What is claimed is:

1. A circuit for generating a cyclic code C bits at a time according to a generator polynomial degree B, the generator polynomial including (A+1) terms connected by addition operations, where A is an integer greater than zero, and B and C are integers greater than one, the circuit comprising:

a group of logic gates that collectively receives B bits of input data and generates $2^B-1-B$ bits of code data; a barrel shifter receiving the B bits of input data, the $2^B-1-B$ bits of code data, and an address signal, using the address signal to select C bits of the received data, and outputting the selected bits as the C bits of code data; and an address generator for generating the address signal.

2. The circuit of claim 1, wherein the B bits of input data and the $2^B-1-B$ bits of output data received by the barrel shifter constitute one ($2^B-1$)-bit cycle of the cyclic code, the address signal has B bits, and the barrel shifter outputs C consecutive bits of the cyclic code.

3. The circuit of claim 1, wherein the group of logic gates comprises $A \cdot (2^B-1-B)$ mutually interconnected two-input exclusive OR gates.

4. The circuit of claim 1, wherein the address generator comprises: a B-bit register storing the address signal; a comparator comparing the address signal with a constant value equal to $(2^B-1)-C-1$ and generating a carry bit; and an adder adding C and the carry bit to the address signal to generate a B-bit sum and storing the B-bit sum in the B-bit register.

5. The circuit of claim 4, wherein the B-bit register operates in synchronization with a clock signal, providing one address signal per pulse of the clock signal.

* * * * *